(12) United States Patent
Zhou

(10) Patent No.: US 9,881,836 B2
(45) Date of Patent: Jan. 30, 2018

(54) METHOD FOR MANUFACTURING SEMICONDUCTOR DEVICE

(75) Inventor: Ming Zhou, Beijing (CN)

(73) Assignee: SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 660 days.

(21) Appl. No.: 13/310,311

(22) Filed: Dec. 2, 2011

(65) Prior Publication Data

US 2013/0062214 A1  Mar. 14, 2013

(30) Foreign Application Priority Data

Sep. 13, 2011  (CN) .......................... 2011 1 0268485

(51) Int. Cl.
    C25D 7/12      (2006.01)
    H01L 21/768    (2006.01)
    H01L 21/288    (2006.01)

(52) U.S. Cl.
    CPC .... *H01L 21/76898* (2013.01); *H01L 21/2885* (2013.01); *H01L 21/76877* (2013.01)

(58) Field of Classification Search
    USPC ....................................................... 205/118
    See application file for complete search history.

(56) References Cited

U.S. PATENT DOCUMENTS

| | | | | |
|---|---|---|---|---|
| 4,140,596 | A  * | 2/1979  | Wobking ...................... | 205/341 |
| 6,210,555 | B1 * | 4/2001  | Taylor et al. ................. | 205/103 |
| 6,398,937 | B1 * | 6/2002  | Menini et al. ................ | 205/125 |
| 2008/0271995 | A1 * | 11/2008 | Savastiouk et al. .......... | 204/273 |
| 2010/0041226 | A1 * | 2/2010  | Reid et al. .................... | 438/614 |

OTHER PUBLICATIONS

First Office Action from corresponding Chinese Patent Appl. No. 2011-10268485.9, dated Apr. 22, 2014.
Second Office Action from corresponding Chinese Patent Appl. No. 201110268485.9, dated Dec. 11, 2014.

* cited by examiner

*Primary Examiner* — Stefanie S Wittenberg
(74) *Attorney, Agent, or Firm* — Koppel, Patrick, Heybl & Philpott

(57) ABSTRACT

A method for manufacturing semiconductor devices comprises: applying a dual pulse power to the semiconductor device during metal electroplating a part of the semiconductor device and applying ultrasonic energy to said semiconductor device during the metal electroplating.

8 Claims, 3 Drawing Sheets

METHOD FOR MANUFACTURING SEMICONDUCTOR DEVICE

CROSS-REFERENCE TO RELATED APPLICATIONS

This application claims priority to a Chinese Patent Application No. 201110268485.9, filed on Sep. 13, 2011 and entitled "Method for Manufacturing Semiconductor Device", which is incorporated herein in its entirety by reference.

FIELD OF THE INVENTION

The present invention relates to semiconductor manufacturing techniques, and more particularly, relates to a method for manufacturing semiconductor devices.

DESCRIPTION OF THE RELATED ART

With the continuous development of semiconductor manufacturing techniques, the critical dimensions of semiconductor devices (especially, logic devices) have been substantially reduced. Correspondingly, via and trench dimensions in backend processes have also been reduced. This means that the metal (e.g. copper) electroplating process has become more and more difficult.

Moreover, in the copper electroplating process according to the prior art, voids 102 may be incurred in copper plugs 104, as shown in FIG. 1. Consequently, it may suffer WAT (wafer acceptance test) failure and result in low process capability (CP) and low yield. Besides, it can also lead to EM failure issues.

Thus, there exists a need for a technology to address the above issues.

SUMMARY OF THE INVENTION

An object of the present invention is to improve metal electroplating process. Another object of the present invention is to improve the gap filling for holes (including through holes and via (or blind via)) and trenches of backend processes. A further object of the present invention is to suppress or eliminate the occurrence of voids in metal electroplating processes, thereby improving WAT pass rate, increasing CP yield, and enhancing reliability.

According to one embodiment of the present invention, there is provided a method for manufacturing semiconductor devices, comprising: applying a dual pulse power to the semiconductor device during metal electroplating of a part of the semiconductor device to be electroplated, and applying an ultrasonic wave to said semiconductor device during the metal electroplating.

Preferably, the part to be electroplated is an opening in a dielectric layer or in a substrate, said opening comprising a trench or a hole, said hole comprising a through hole or a blind via.

Preferably, said dual pulse power has a pulse frequency ranging from 1800 KHz to 5000 KHz.

Preferably, said dual pulse power has a ratio of forward-pulse current to inverse-pulse current ranging from 5:1 to 10:1 during one pulse of the cycle.

Preferably, said dual pulse power has a ratio of forward-pulse duration to inverse-pulse duration ranging from 10:1 to 20:1.

Preferably, said ultrasonic wave is applied intermittently.

Preferably, said ultrasonic wave is applied periodically.

Preferably, a duration of applying the ultrasonic wave each time is 5-20 seconds.

Preferably, said ultrasonic wave has a frequency of 1000-5000 Hz and a power of 50-1500 W.

Preferably, said method further comprises Forming, before the electroplating, a metal seed layer on a surface of the part to be electroplated.

Other advantages, objects and aspects of the present invention will become apparent from the following detailed description in conjunction with the accompanying drawings.

BRIEF DESCRIPTION OF THE DRAWINGS

The accompanying drawings, which are incorporated in and constitute a part of the specification, together with the description, serve to explain the principles of the invention. the present invention will be readily understood by reading the following detailed description with reference to the accompanying drawings, in which.

It should be appreciated that these drawings are merely illustrative and are not intended to limit the scope of the present invention. In the figures, various components have not been drawn strictly to scale or to their actual shapes, wherein, some constitute components (e.g. layers or parts) can be magnified with respect to others, for the purpose of more clearly illustrating the principles of the present invention. Moreover, those details that would otherwise obscure the gist of the present invention are not shown in the figures.

DESCRIPTION OF THE EMBODIMENTS

Embodiments of the present invention will be described in conjunction with the accompanying drawings.

Figure 1:
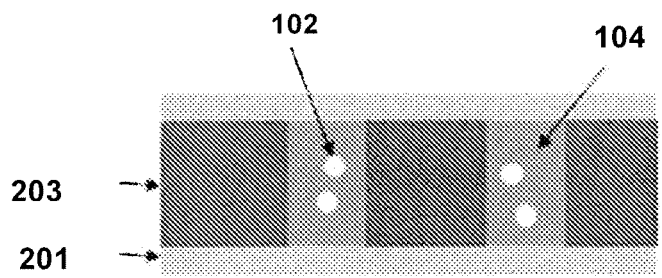
FIG. 1 is an illustrative diagram showing voids incurred during a metal (e.g. copper) electroplating process according to the prior art.
Figure 2:
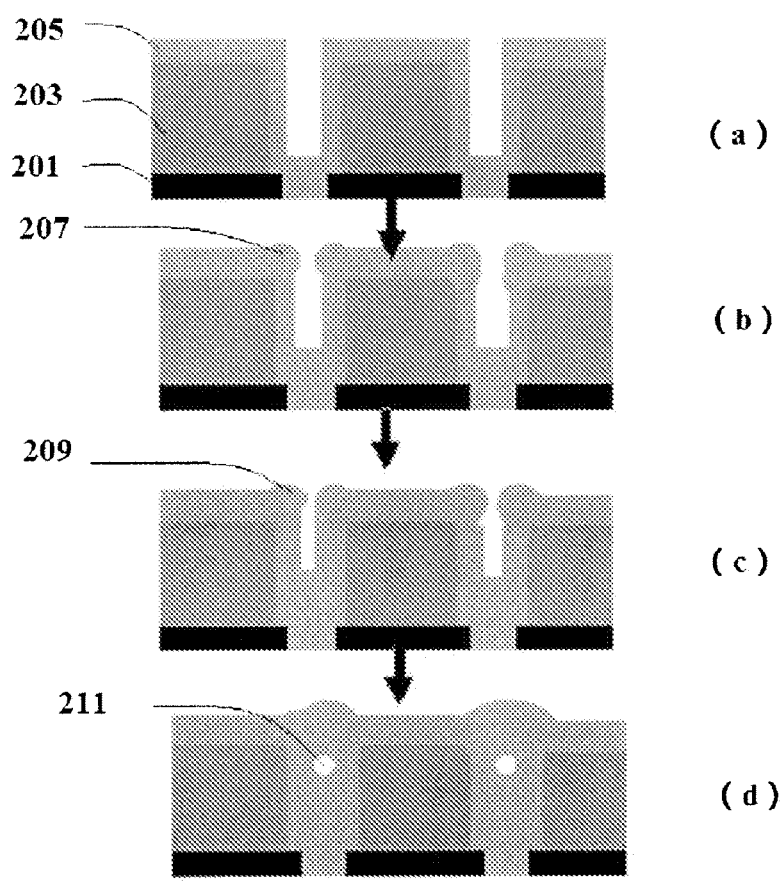
FIG. 2 is an illustrative diagram showing in detail the formation of electroplated layers during a metal electroplating process according to the prior art.

FIG. 2 shows in detail the formation of plating during a metal electroplating process according to the prior art.

As shown in FIG. 2(a), on a copper barrier 201 in a device, a patterned (e.g. having through hole or via (e.g. blind via)) dielectric layer 203 is formed. The copper barrier 201 can be formed, for example, on a semiconductor substrate (not shown). Generally, as known in the art, the device can be immerged into a copper-ion contained solution and a negative potential is applied to the substrate, so that the copper ions are concentrated toward the substrate and are subjected to reduction reactions at the substrate surface, and thus the substrate is plated with copper.

At an initial stage of the electroplating process, the formed metal (e.g. copper) 205 conformally covers the bottom and sidewalls of the hole as well as the surface of the substrate.

Since electroplating is apt to occur at corners which are protruding, projections 207 are formed at these corner as the thickness of the copper plating layer increases, as indicated by reference number 207 in FIG. 2(*b*). Moreover, as the thickness of the copper plating layer further increases, projections 207 that are located at the corners of the two ends of the hole increase gradually such that the projections becomes more and more closer and the distance therebetween gets smaller, as indicated by reference number 209 in FIG. 2(*c*). When the copper plating layer reaches a certain thickness, adjacent projections at corners of the two ends of the hole would finally joint together, and thus void 211 may be formed in copper plugs that are formed by filling the holes, as shown in FIG. 2(*d*).

After carefully studying the electroplating process of, for example, copper, the inventor proposes the present invention to suppress or overcome the above issues or shortcomings existing in the prior art.

Figure 3:
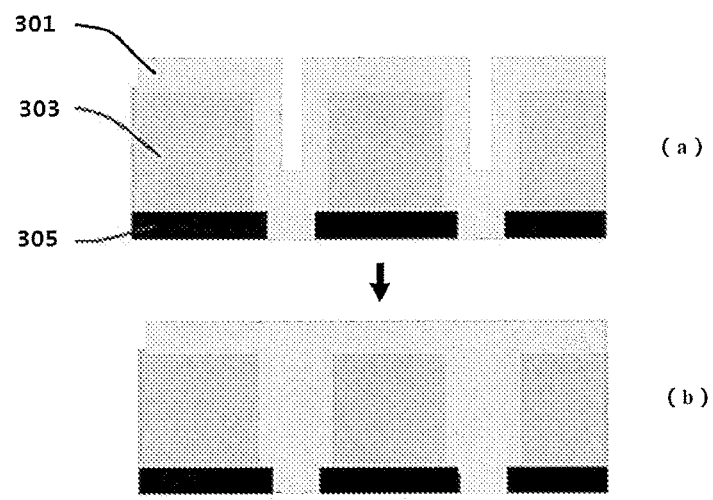
FIG. 3 is an illustrative diagram showing a method for manufacturing semiconductor devices according to an embodiment of the present invention.

FIG. 3 is an illustrative diagram showing a method for manufacturing semiconductor device according to an embodiment of the present invention.

In the method for manufacturing semiconductor device according to the present invention, during the process of electroplating a device with metal, a dual pulse power is applied to the device.

As shown in FIG. 3, a copper barrier 305 is formed on the substrate (not shown), and a patterned dielectric layer 303 is formed on the copper barrier 305. The dielectric layer 303 can be a low-k dielectric. The dielectric layer 303 may have an opening. The opening can include a trench or a hole, and the hole can include a through hole, a via (e.g. blind via), a through-substrate hole (e.g. so-called through silicon hole), or the like.

Herein, the opening serves as a part of the device to be electroplated with copper, and more accurately, the surface (e.g. sidewalls and bottom surface) of the opening serves as the part to be electroplated with copper. However, it should be appreciated that this is merely illustrative. Actually, those of ordinary skill in the art can freely select a part to be electroplated as needed, such as the substrate, layer(s), or the like.

In order to be electroplated with copper 301, the device can be immerged into a copper-ion contained solution. For example, a clamp can be used for holding the device (in most cases, for holding a wafer on which the device is formed), and a dual pulse power is applied to the semiconductor device (for example, using said clamp as electrodes for applying the power). The dual pulse power has both a positive potential pulse and a negative potential pulse during one pulse cycle, and accordingly has both a positive pulse current (or voltage) and a negative pulse current (or voltage).

Figure 4:
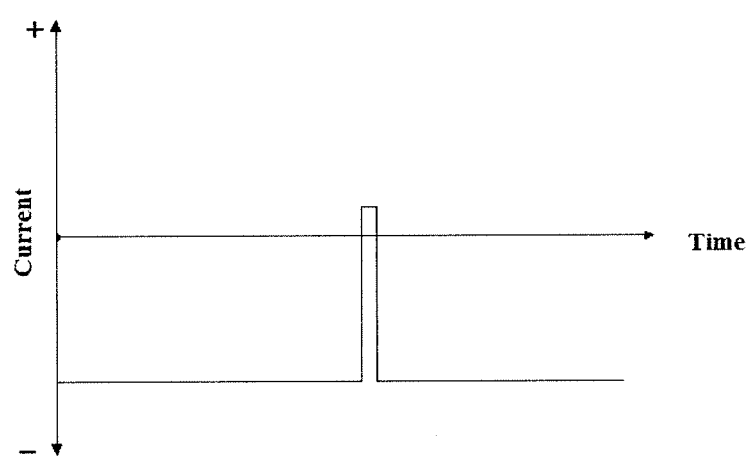
FIG. 4 is an illustrative diagram showing the characteristics of the applied dual pulse power according to an embodiment of the present invention.

FIG. 4 schematically shows the characteristics of the applied dual pulse power according to an embodiment of the present invention. Those of ordinary skill in the art will appreciate that, for example, when applying a negative pulse (also called forward pulse or forward anode pulse, that is, for example, the anode connected to a positive voltage and the device connected to a negative voltage) to the device, or to say, when applying a negative pulse to a part of the device to be electroplated (e.g. the substrate or surface or layer of any other constituent), the device or the part of the device to be electroplated is at a negative potential so that metal ions (e.g. copper ions) are subjected to reduction reactions at the surface of the device or the part of the device to be electroplated, and thus the surface of the device (or the surface to be electroplated) is electroplated with copper.

When applying a positive pulse (also called inverse pulse or inverse anode pulse, that is, for example, the anode connected to a negative voltage and the device connecting to a positive voltage) to the device, or to say, when applying a positive pulse to a part of the device to be electroplated (e.g. the substrate or any other constituent (such as, surfaces or layers), the device or the part of the device to be electroplated is at a positive potential, and thus ions in the solution are repelled away from the device, and a metal oxidation reaction occurs at the surface of the device or the part of the device to be electroplated, such that a part of the metal (e.g. copper) electroplated is dissociated (or ionized).

According to some embodiments of the present invention, the dual pulse power has a pulse cycle (or frequency) ranging from about 1800 KHz to 5000 KHz. In addition, preferably, the dual pulse power has a ratio of forward-pulse current to inverse-pulse current ranging from 5:1 to 10:1 during one pulse cycle. More preferably, the dual pulse power has a ratio of forward-pulse duration to inverse-pulse duration ranging from 10:1 to 20:1 during one pulse cycle.

In the schematic example of FIG. 4, the negative (−) current (i.e. the amplitude of the forward pulse) is five times the positive (+) current (i.e. the amplitude of the inverse pulse), while the duration of the forward pulse is 20 times of the duration of the inverse pulse. It should be appreciated that, the waveform of such dual pulse power is merely schematic but not for limiting the scope of the present invention.

Preferably, the dual pulse power is applied to the substrate (device) at the beginning of the electroplating, until the electroplating is completed (for example, the hole is completely filled, or the metal is plated to a desirable thickness, or the like).

In some preferred embodiments of the present invention, during the electroplating process, ultrasonic waves can be applied to the device while the dual pulse power is applied to the device. Generally, when applying ultrasonic energy to the device, the solution around the device would naturally be affected. Thus, in some implementations, ultrasonic energy is applied to the entire solution in which the device is immerged. The micro jet of the ultrasonic wave can improve the distribution of the copper ions in the solution. According to the present invention, by applying an ultrasonic wave while electroplating, gap fill in opening (e.g. hole or trench) can be improved and the quality of the electroplated copper layer can be enhanced.

Preferably, the ultrasonic wave has a frequency of 1000-5000 Hz, and a power of 50-1500 W.

In some preferred embodiments of the present invention, during the electroplating process, ultrasonic waves can be applied intermittently, that is, ultrasonic is applied repeatedly (multiple times). In other embodiments, the intermittent application of ultrasonic can be periodic. The duration of applying ultrasonic wave can be the same or different each time. In addition, preferably, the duration for applying ultrasonic once can be 5-20 seconds, but a longer or shorter duration can also be applicable in some other embodiments.

As would be appreciated by those of ordinary skill in the art, the copper mentioned in the above embodiments merely serves as an example of metal; the present invention can likewise be applied to electroplate other suitable metals, such as nickel, silver, or the like. Moreover, as would be known from the following embodiment, the copper barrier is not essential for the present invention.

Further, preferably, before electroplating the substrate, the opening (that is, a part to be electroplated) can be metalized. For example, a copper seed layer can be formed on the sidewalls and bottom surface of the opening. The seed layer can be formed by means of physical vapour deposition (PVD), for example.

In addition, although it is shown in the above embodiment that the patterned dielectric having openings is electroplated with metal, the present invention is not limited thereto.

Figures 5A, 5B:
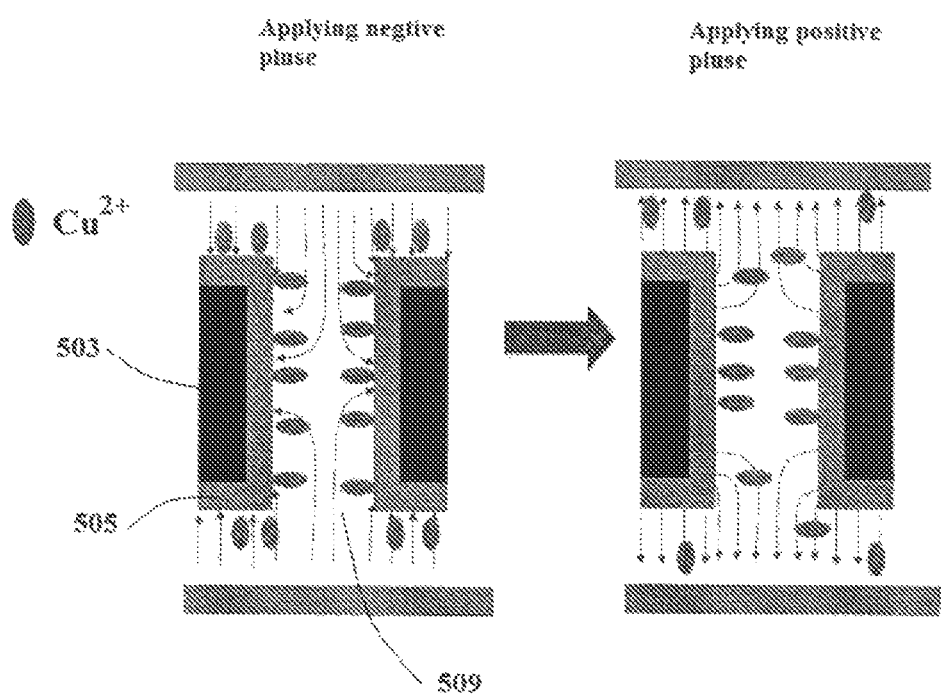
FIGS. 5A and 5B show a method of manufacturing a semiconductor device according to another embodiment of the present invention.

FIGS. 5A and 5B show a method for manufacturing semiconductor device according to another embodiment of the present invention, wherein, a substrate 503 having an opening 509 is electroplated with copper. Herein, the opening 509 is shown as a through-substrate hole, but it should be appreciated that the present invention is not limited thereto.

The view FIG. 5A shows a situation of applying a negative pulse to the substrate, in which, the distribution of copper ions in the solution is schematically shown. At this point, copper ions are concentrated around the surfaces of the substrate 503 and the opening 509, and are subjected to reduction reactions at the surfaces, and thus the surfaces are plated with copper.

The view of FIG. 5B shows a situation of applying a positive pulse to the substrate, in which, the distribution of copper ions in the solution is schematically shown. At this point, since the copper ions is positively charged, they are repelled away from the surfaces of the substrate 503 and the opening 509, and copper oxidation reaction takes place at the surfaces, that is, a part of the electroplated copper is dissociated into ions.

Preferably, the dual pulse power has a ratio of forward-pulse current to inverse-pulse current ranging from 5:1 to 10:1 during one pulse cycle. Alternatively, the dual pulse power has a ratio of forward-pulse duration to inverse-pulse duration ranging from 10:1 to 20:1 during one pulse cycle. It should be appreciated that, such ratios of forward-pulse current/duration to inverse-pulse current/duration are not necessarily in such ranges, but can be any suitable numerical values, so long as the electroplated copper is partially dissociated and the overall trend that the copper is electroplated is not changed.

Since the dissociation of a part of the electroplated copper is also apt to occur at the corners as illustrated in FIG. 2, the copper can be uniformly electroplated and fill the opening 509, thereby voids are prevented from being formed when filling the opening 509.

Moreover, ultrasonic wave can be applied (e.g. intermittently) during the electroplating process, so as to improve the distribution of copper ions in the electroplating solution, and thus further enhance the quality of the electroplated copper layer obtained.

The embodiments of the present invention have been described above with reference to the drawings. However, it should be understood that these embodiments are only intended to be illustrative but not to limit the scope of the present invention. These embodiments can be freely combined without going beyond the scope of the present invention. In addition, those of ordinary skill in the art can modify the embodiments and details of the present invention based on the teachings of the present invention, without departing from the scope and spirit of the present invention. And thus, all the modifications should be embraced within the scope and spirit of the present invention as claimed by the attached claims.

What is claimed is:

1. A method for manufacturing semiconductor devices, comprising:
    applying a dual pulse power to the semiconductor device during metal electroplating on a part of the semiconductor device, and applying an ultrasonic wave to the semiconductor device during the metal electroplating;
    wherein the dual pulse power has a pulse frequency ranging from 1800 kHz to 5000 kHz;
    wherein the dual pulse power has a ratio of forward-pulse current to inverse-pulse current ranging from 5:1 to 10:1 during one pulse cycle;
    wherein the dual pulse power has a ratio of forward-pulse duration to inverse-pulse duration ranging from 10:1 to 20:1 during one pulse cycle; and
    wherein said ultrasonic wave has a frequency of 1000 Hz to 5000 Hz and a power of 50 W to 1500 W.

2. The method of claim 1, wherein the part to be electroplated is an opening in a dielectric layer or in a substrate.

3. The method of claim 1, wherein the ultrasonic wave is applied intermittently.

4. The method of claim 3, wherein the applying of the ultrasonic wave is conducted periodically.

5. The method of claim 3, wherein a duration of applying the ultrasonic wave each time is 5 seconds to 20 seconds.

6. The method of claim 1, further comprising:
    forming, before the electroplating, a metal seed layer on a surface of the part to be electroplated.

7. The method of claim 2, wherein the opening comprises a trench or a hole.

8. The method of claim 7, wherein the hole comprises a through hole or a blind via.

* * * * *